United States Patent [19]

Sasayama

[11] Patent Number: 4,585,962
[45] Date of Patent: Apr. 29, 1986

[54] SEMICONDUCTOR SWITCHING DEVICE UTILIZING BIPOLAR AND MOS ELEMENTS

[75] Inventor: Takao Sasayama, Hitachi, Japan

[73] Assignee: Hitachi, Ltd., Tokyo, Japan

[21] Appl. No.: 518,696

[22] Filed: Jul. 29, 1983

[30] Foreign Application Priority Data

Aug. 6, 1982 [JP] Japan ................................. 57-136261

[51] Int. Cl.$^4$ ............................................ H03K 17/12
[52] U.S. Cl. ................................... 307/570; 307/270; 307/299 A; 307/305; 307/446; 357/43
[58] Field of Search .......... 307/446, 570, 270, 252 C, 307/252 L, 305, 299 A; 357/38, 38 T, 23 VD, 43, 36

[56] References Cited

U.S. PATENT DOCUMENTS

| 4,419,683 | 12/1983 | Herberg .......................... 307/305 X |
| 4,464,673 | 8/1984 | Patalong .......................... 307/305 X |
| 4,466,010 | 8/1984 | Patalong ...................... 307/252 C X |

FOREIGN PATENT DOCUMENTS 2088631  6/1982  United Kingdom .............. 357/38 T

OTHER PUBLICATIONS

Tihanyi, "Functional Integration of Power MOS and Bipolar Devices", IEEE IEDM, Washington, D.C., 1980.

Primary Examiner—Stanley D. Miller
Assistant Examiner—D. R. Hudspeth
Attorney, Agent, or Firm—Antonelli, Terry & Wands

[57] ABSTRACT

A semiconductor switching device is disclosed in which a bipolar transistor has a plurality of emitter electrodes and in which each of said emitter electrodes is connected to one of a plurality of MOS transistors (so that the number of MOS transistors corresponds to the number of emitter electrodes of the bipolar transistor). The drains of the MOS transistors are connected in common, and the gate electrode and source electrode of each MOS transistor are each connected in common to the gate electrodes and source electrodes of the other MOS transistors.

9 Claims, 4 Drawing Figures

SEMICONDUCTOR SWITCHING DEVICE UTILIZING BIPOLAR AND MOS ELEMENTS

BACKGROUND OF THE INVENTION

This invention relates generally to a semiconductor switching device.

When current and voltage are dealt with in bipolar transistors (which are the most often used type of semiconductor switching device), the following problems occur:

(1) Since the current distribution is not uniform and the current concentrates locally, the effective emitter area decreases (to approximately 40% of a GTO (gate turn-off thyristor), for example) and the utilization efficiency is low. Accordingly, the chip area and the cost of the device increase.

(2) Since the current is not uniform, the bias condition between the emitter and base is also non-uniform so that the operation of extracting excess carriers when the device is switched off becomes slow locally and so a high speed performance can not be obtained.

When compared with the bipolar transistor described above, a MOS transistor has the drawbacks that its resistance when on is great, a large current density can not be handled easily, and it is difficult to increase the withstand voltage of a MOS transistor.

SUMMARY OF THE INVENTION

It is therefore an object of the present invention to provide a semiconductor switching device which eliminates the problems with the prior art described above.

To accomplish this object, the present invention provides a semiconductor switching device in which the utilization ratio of the emitter area is improved by eliminating the non-uniformity of current density of a bipolar transistor by distributing the current density uniformly over the entire surface of the emitters by using the on-resistance of MOS transistors that are connected in series with the emitters, which can thus have a reduced chip area production cost, and which can operate at a high switching speed.

DESCRIPTION OF THE PREFERRED EMBODIMENTS

Figure 1:
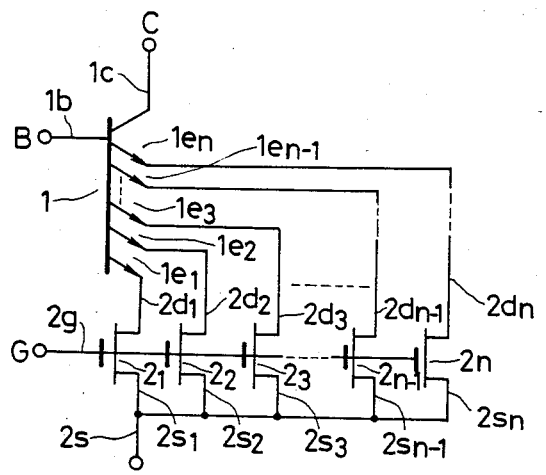
FIG. 1 is a circuit diagram of a semiconductor switching device in accordance with one embodiment of the present invention.

In FIG. 1, showing a semiconductor switching device in accordance with one embodiment of the present invention, a bipolar transistor 1 has a collector $1_c$, a base $1_b$ and emitters $1_{e1}$ through $1_{en}$. The emitters are of a multiple structure. The semiconductor switching device also includes enhancement MOS transistors $2_1$ through $2_n$, and the emitters $1_{e1}$ through $1_{en}$ of the bipolar transistor 1 are connected to drains $2_{d1}$ through $2_{dn}$ of the MOS transistors, respectively. The gates of the MOS transistors $2_1$ through $2_n$ are connected in common and are taken out as an electrode G, while their sources $2_{s1}$ through $2_{sn}$ are also connected in common and are taken out as an electrode E.

The structure of the semiconductor switching device having the circuit described above is illustrated in FIG. 2. An $N^-$-type layer 11 is formed over an $N^+$-type semiconductor substrate 10 and a P-type layer 12 is formed over the $N^-$-type layer 11. A metal layer 9 is deposited on the reverse of the $N^+$-type semiconductor substrate 10 by evaporation or similar means, thereby forming an electrode C. A plurality of N-type diffusion layers 15 are selectively formed on the surface of the P-type layer 12, and P-type diffusion layers 13 are each formed inside the N-type diffusion layers 15. $N^+$-type diffusion layers 14 are each formed inside the P-type diffusion layers 13. The N-type diffusion layers 15 function as the emitters of the bipolar transistor and as the drains of the MOS transistors and are connected in common. Electrodes 18 are taken out from the P-type layer 12 between each adjacent pair of N-type diffusion layers 15, and are connected in common to form an electrode B. Electrodes 17 are taken out from the $N^+$-type diffusion layers 14 and are connected in common to form the electrode E. Gate electrodes 16 are formed in regions on the P-type diffusion layers 13 between the electrodes 18 and the electrodes 17 via an insulating film 19 and are connected in common to form the electrode G.

Figure 3:
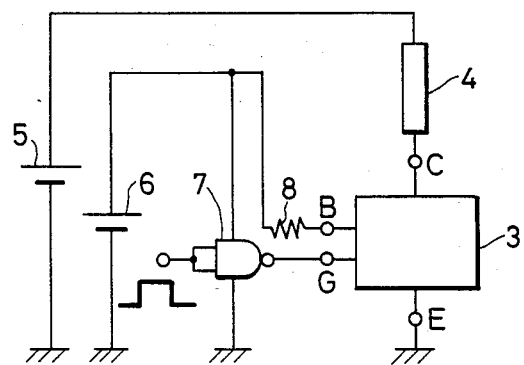
FIG. 3 is a circuit diagram showing the method of driving the semiconductor switching device shown in FIG. 1.

The semiconductor switching device having the construction described above is used in the following manner. As shown in FIG. 3, a load 4 is connected to the electrode C of the semiconductor switching device 3 and a power source 5 is inserted between the other end of the load 4 and the electrode E which is grounded. A bias current is applied to the electrode B of the semiconductor switching device 3 from a power source 6 through a resistor 8. A logic output is applied from a gate 7 consisting of a MOS LSI or the like, for example, to the electrode G of the semiconductor switching device 3.

In the circuit arrangement described above, the N-channel enhancement MOS transistors $2_1$ through $2_n$ are turned off when no signal voltage is applied to the electrode G. Hence, the bipolar transistor 1 is kept cut off. When a signal voltage is applied to the electrode G, the transistor 1 is driven to be turned on by a bias current supplied through the resistor 8.

At the same time, each MOS transistor connected to the emitters $1_{e1}$-$1_{en}$ of the bipolar transistor attains the state in which a large number of carriers move between the source and drain thereof, and $r_e$ becomes an on-resistance having a value of several tens of ohms. As a result, the emitter current is given by:

$$i_e = i_g(e^{q/KT(V-i_e r_e)} - 1) \tag{1}$$

Thus, the temperature dependence of $i_e$ can be reduced as $r_e$ increases. In other words, a positive heat-to-current feedback operation can be reduced, and local concentrations of current can be avoided. As a result, the effective utilization efficiency of the emitter areas can be improved and a device having the same current capacity can be realized in a reduced area. Since the current distribution can be made uniform, the quantity of stored carriers in the base layer is also made uniform at each emitter-base junction, and it can also be switched off at high speed because this proceeds at an average speed per unit area.

As described above, since the semiconductor switching device of this embodiment applies a driving input to transistors, the d.c. input impedance is substantially infinite and LSIs and other MOS logic devices can be driven directly. The device of the present embodiment provides the following advantages in comparison with MOS transistors, bipolar transistors, or other composite devices:

(1) Since a bipolar transistor is used for the output stage, a device having a lower saturation voltage and a greater current capacity than a device using MOS power transistors can be obtained.

(2) The MOS transistors do not need to withstand a load voltage but can have a much lower withstand voltage than MOS power transistors and MOS input bipolar transistors. This means that the high withstand voltage depletion layer ($n^-$-layer) can be eliminated and the capacitance of this layer does not become an input capacitance. Hence, a high a.c. impedance can be obtained, the capacitance load can be reduced and a logic device can be operated at a low voltage, but at high speed.

(3) In comparison with a bipolar device, the device of the invention has a higher input impedance, can be driven more easily, and has a more even current distribution. Accordingly, the effective emitter area is greater and a device of the same current rating can be realized at a smaller size and with a lower production cost.

Figure 2:
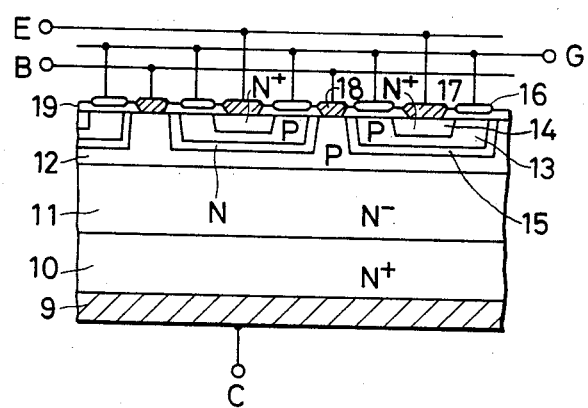
FIG. 2 is a section through the structure of the semiconductor switching device shown in FIG. 1.
Figure 4:
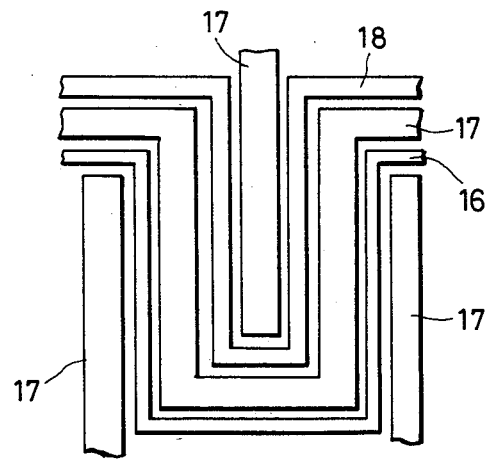
FIG. 4 is a top view of another embodiment of the semiconductor switching device.

In the embodiment described above, a plurality of N-type diffusion layers 15, in which P-type diffusion layer 13 and $N^+$-type diffusion layer 14 are formed, are formed separately and independently of one another, as shown by the electrode patterns of electrodes 16, 17 and 18 in FIG. 2, but they can of course be arranged in a zigzag manner, for example, as shown in FIG. 4, by connecting them mutually.

As described above, the semiconductor switching device in accordance with the present invention enables an increased utilization ratio of the emitter area, a reduction of the chip area as well as the production cost, and a high-speed switching operation.

What is claimed is:

1. A semiconductor switching device comprising:
   a bipolar transistor having a collector electrode connected to a collector terminal of said switching device, a base electrode connected to a base terminal of said switching device, and a plurality of emitter electrodes;
   a plurality of MOS transistors wherein the number of said MOS transistors is the same as the number of emitter electrodes of said bipolar transistors, and wherein said MOS transistors each have a gate electrode coupled to a gate terminal of said switching device;
   first connection means for connecting each of the plurality of emitter electrodes of said bipolar transistor to a corresponding drain electrode of said MOS transistors;
   second connection means for connecting in common the source electrodes of said MOS transistors to an emitter terminal of said switching device;
   means for transmitting a control signal to said gate terminal of said switching device to control the ON-OFF states of said MOS transistors; and
   means for providing a bias signal to said base terminal of said switching device so that said bipolar transistor will be driven into an ON state by said bias signal when said control signal drives said MOS transistors into an ON state to provide a main current flow between said collector and emitter terminals of said switching device.

2. The semiconductor switching device as defined in claim 1 wherein the gate electrodes of said MOS transistors are connected to said gate terminal of said switching device through a common conduction means.

3. The semiconductor switching device as defined in claim 1 wherein the transconductances of the plurality of MOS transistors are uniform.

4. A semiconductor switching device as defined in claim 1, wherein said semiconductor switching device is formed on a common semiconductor chip.

5. A semiconductor switching device as defined in claim 2, wherein said semiconductor switching device is formed on a common semiconductor chip.

6. A semiconductor switching device as defined in claim 3, wherein said semiconductor switching device is formed on a common semiconductor chip.

7. A semiconductor switching device as defined in claim 1, wherein said MOS transistors are in an OFF state when no control signal is applied to said gate terminal of said switching device, and further wherein said MOS transistors are in an ON state when said control signal is applied to said gate terminal of said switching device.

8. A semiconductor switching device as claimed in claim 2, wherein said MOS transistors are in an OFF state when no current signal is applied to said gate terminal of said switching device, and further wherein said MOS transistors are in an ON state when said control signal is applied to said gate terminal of said switching device.

9. A semiconductor switching device as claimed in claim 3, wherein said MOS transistors are in an OFF state when no control signal is applied to said gate terminal of said switching device, and further wherein said MOS transistors are in an ON state when said control signal is applied to said gate terminal of said switching device.

* * * * *